United States Patent
Bu et al.

(10) Patent No.: US 9,589,851 B2
(45) Date of Patent: Mar. 7, 2017

(54) DIPOLE-BASED CONTACT STRUCTURE TO REDUCE METAL-SEMICONDUCTOR CONTACT RESISTANCE IN MOSFETS

(71) Applicants: International Business Machines Corporation, Armonk, NY (US); GlobalFoundries, Inc., Grand Caymen (KY); The Research Foundation for The State University of New York, Albany, NY (US)

(72) Inventors: Huiming Bu, Millwood, NY (US); Hui-feng Li, Guilderland, NY (US); Vijay Narayanan, New York, NY (US); Hiroaki Niimi, Cohoes, NY (US); Tenko Yamashita, Schenectady, NY (US)

(73) Assignees: INTERNATIONAL BUSINESS MACHINES CORPORATION, Armonk, NY (US); GLOBALFOUNDRIES INC., Grand Cayman (KY); THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 14/800,970

(22) Filed: Jul. 16, 2015

(65) Prior Publication Data
US 2017/0018463 A1   Jan. 19, 2017

(51) Int. Cl.
*H01L 23/532* (2006.01)
*H01L 23/528* (2006.01)
(Continued)

(52) U.S. Cl.
CPC .......... *H01L 21/823871* (2013.01); *H01L 21/823821* (2013.01); *H01L 23/5283* (2013.01);
(Continued)

(58) Field of Classification Search
None
See application file for complete search history.

(56) References Cited

U.S. PATENT DOCUMENTS 8,110,877 B2 * 2/2012 Mukherjee ........ H01L 21/28512
257/288
8,143,676 B2 3/2012 Inumiya et al.
(Continued)

OTHER PUBLICATIONS

Coss, Brian E., et al.; CMOS Band-Edge Schottky Barrier Heights Using Dielectric-Dipole Mitigated (DDM) Metal/Si for Source/Drain Contact Resistance Reduction; 2009 Symposium on VLSI Technology Digest of Technical Papers; p. 104-105; 2009.*
(Continued)

*Primary Examiner* — Marc Armand
*Assistant Examiner* — Younes Boulghassoul
(74) *Attorney, Agent, or Firm* — Cantor Colburn LLP; Vazken Alexanian

(57) ABSTRACT

A transistor device includes a substrate; a source region and a drain region formed over the substrate; and a source/drain contact formed in contact with at least one of the source region and the drain region, the source/drain contact including a conductive metal and a bilayer disposed between the conductive metal and the at least one of the source and drain region, the bilayer including a metal oxide layer in contact with the conductive metal, and a silicon dioxide layer in contact with the at least one of the source and drain region.

15 Claims, 13 Drawing Sheets

(51) Int. Cl.
*H01L 27/092* (2006.01)
*H01L 21/8238* (2006.01)
*H01L 23/535* (2006.01)

(52) U.S. Cl.
CPC ........ *H01L 23/535* (2013.01); *H01L 23/5329* (2013.01); *H01L 27/0924* (2013.01)

(56) References Cited

U.S. PATENT DOCUMENTS

| | | | |
|---|---|---|---|
| 8,373,199 B2 | 2/2013 | Ng et al. | |
| 8,872,172 B2 | 10/2014 | Cheng et al. | |
| 8,927,418 B1* | 1/2015 | Lin | H01L 21/02164 257/734 |
| 8,941,184 B2 | 1/2015 | Ando et al. | |
| 9,018,709 B2* | 4/2015 | Takeoka | H01L 21/823842 257/369 |
| 9,240,480 B2* | 1/2016 | Xu | H01L 29/41725 |
| 9,287,138 B2* | 3/2016 | Wang | H01L 23/485 |
| 2010/0320510 A1* | 12/2010 | Loh | H01L 21/28518 257/288 |
| 2014/0124842 A1 | 5/2014 | Wang et al. | |
| 2014/0264494 A1 | 9/2014 | Xu | |
| 2014/0264634 A1 | 9/2014 | Lee | |
| 2015/0035073 A1 | 2/2015 | Ando et al. | |
| 2016/0104646 A1* | 4/2016 | Hung | H01L 21/823475 438/666 |
| 2016/0148846 A1* | 5/2016 | Ok | H01L 21/28008 257/369 |

OTHER PUBLICATIONS

Agrawal, Ashish, et al.; "A Unified Model for Insulator Selectiion to Form Ultra-Low Resistivity Metal-Insulator-Semiconductor Contacts to n—Si, n—Ge, and n—InGaAs"; Applied Physics Letters; vol. 101; 042108-1-042108-4; 2012.

Liao, M.-H., et al.; "Experimental Demonstration on the Ultra-Low Source/Drain Resistance by Metal-Insulator-Semiconductor Contact Structure in In0.53Ga0.47AS Field-Effect Transistors"; AIP Advances; vol. 3; 092118-1-092118-5; 2013.

Lin, J.-Y. Jason, et al.; "Reduction in Specific Contact Resistivity to n+ Ge Using TiO2 Interfacial Layer"; IEEE Electron Device Letters; vol. 33, No. 11; p. 1541-1543; Nov. 2012.

Majumdar, Kausik, et al.; "Contact Resistance Improvement by Dielectric Breakdown in Semiconductor-Dielectric-Metal Contact"; Applied Physics Letters; vol. 102; p. 113505-1-113505-4; 2013.

Manik, Prashanth Paramahans, et al.; Fermi-Level Unpinning and Low Resistivity in Contacts to n-type Ge with a Thin ZnO Interfacial Layer; Applied Physics Letters; vol. 101; p. 182105-1-182105-5; 2012.

List of IBM Patents or Patent Applications Treated as Related— Date Filed: Feb. 9, 2016; 1 page.

Takashi Ando, et al.; "Dual Metal-Insulator-Semiconductor Contact Structure and Formulation Method"; U.S. Appl. No. 14/862,894, filed Sep. 23, 2015.

* cited by examiner

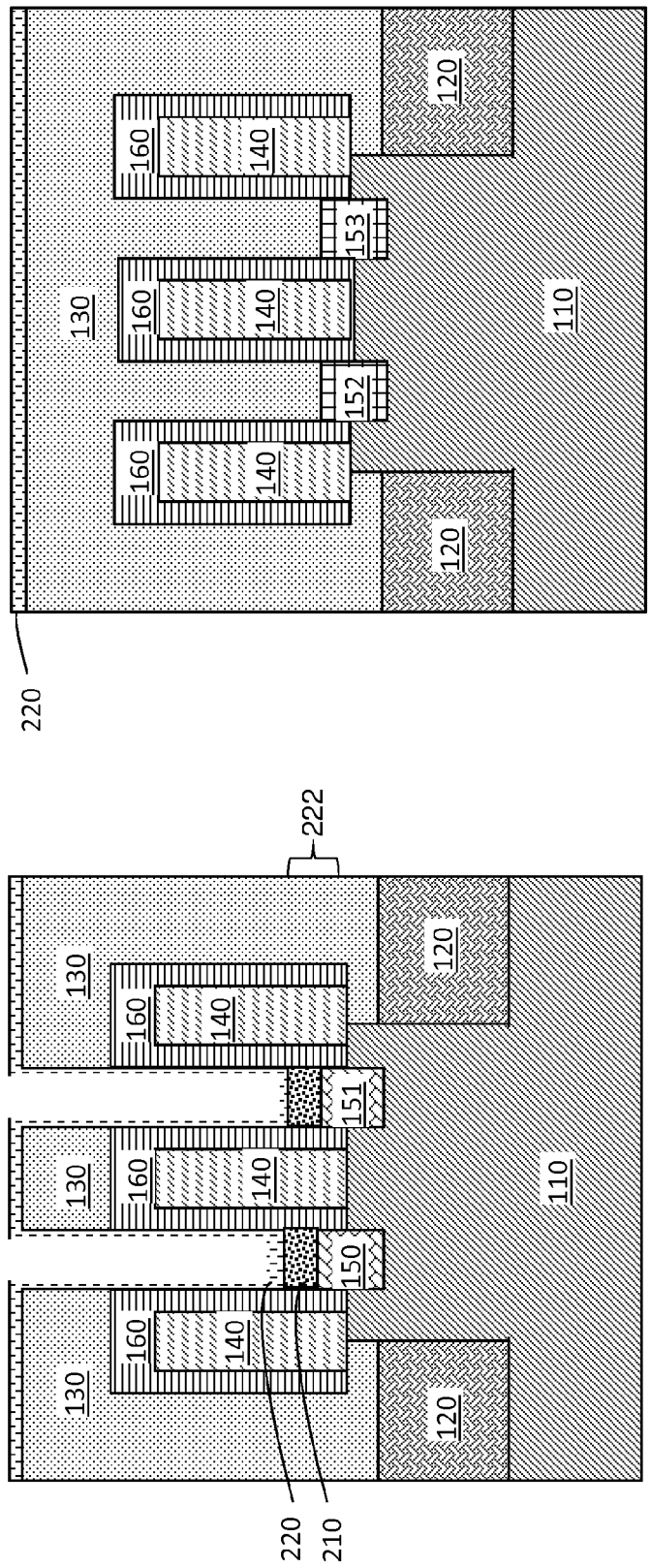

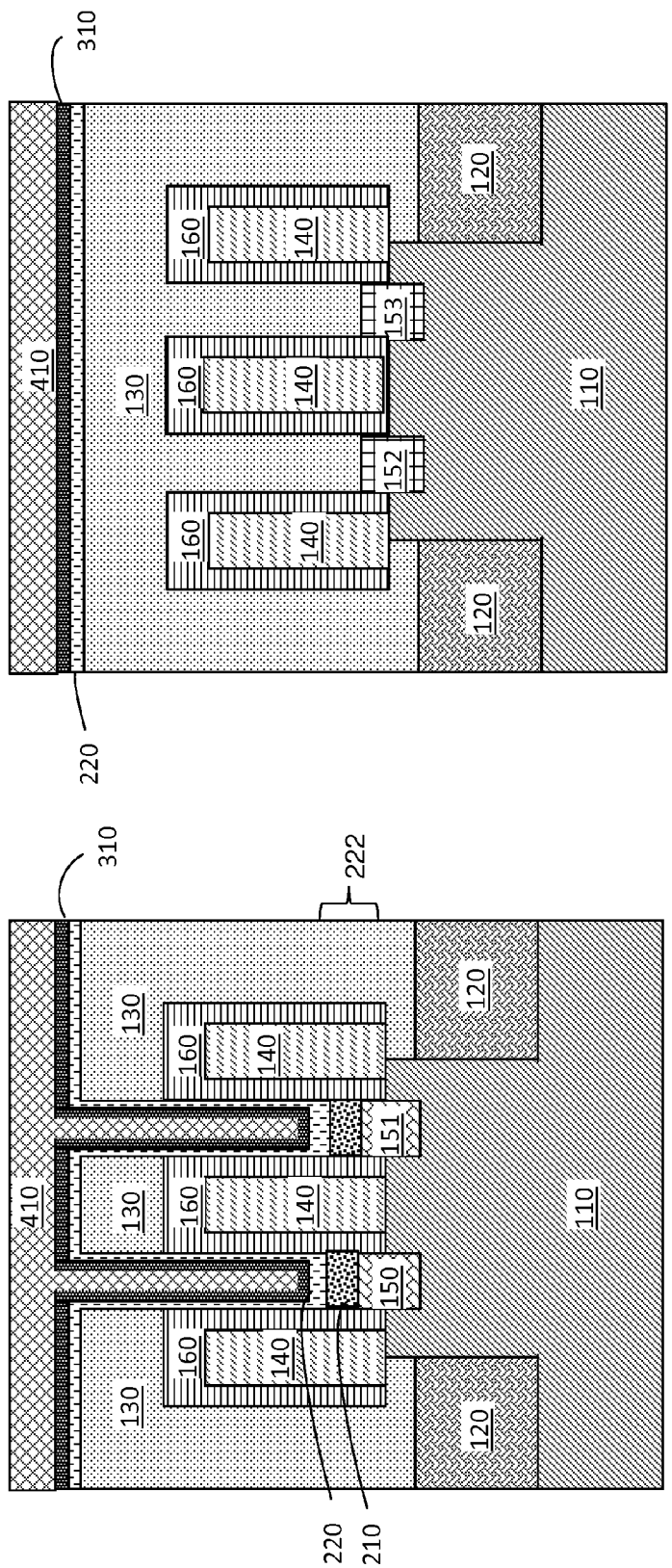

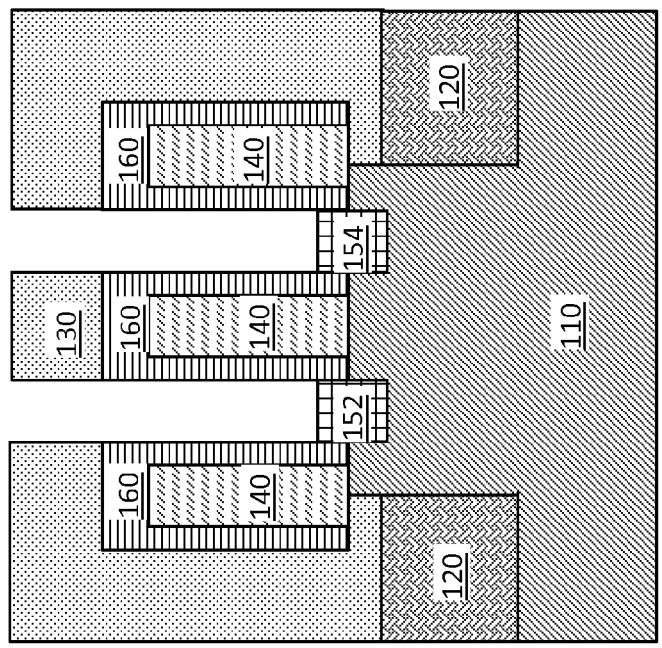
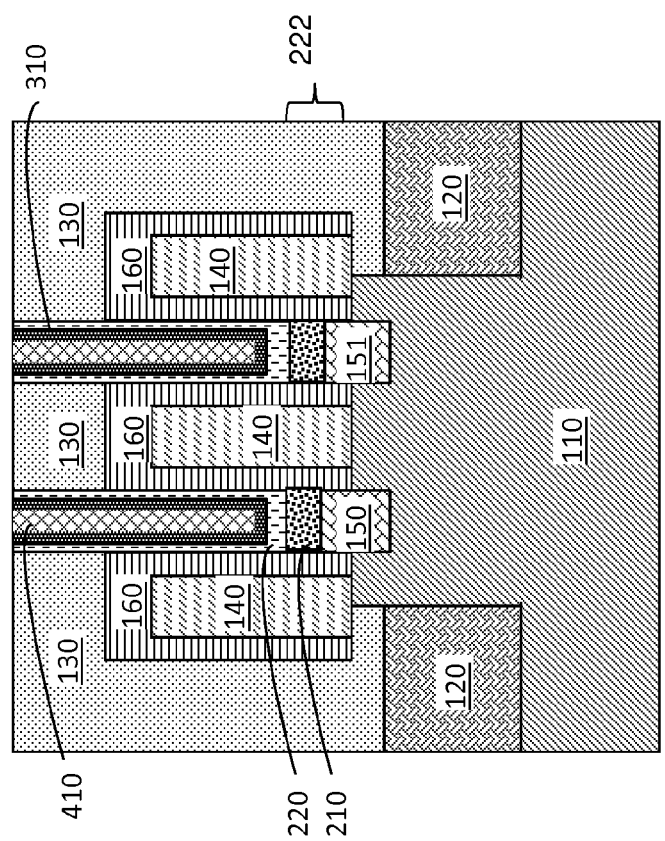

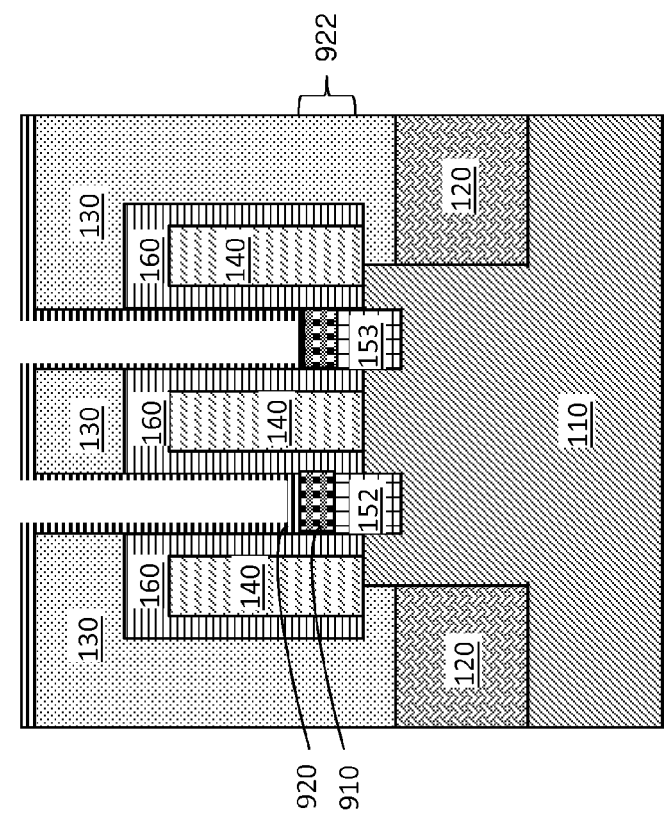
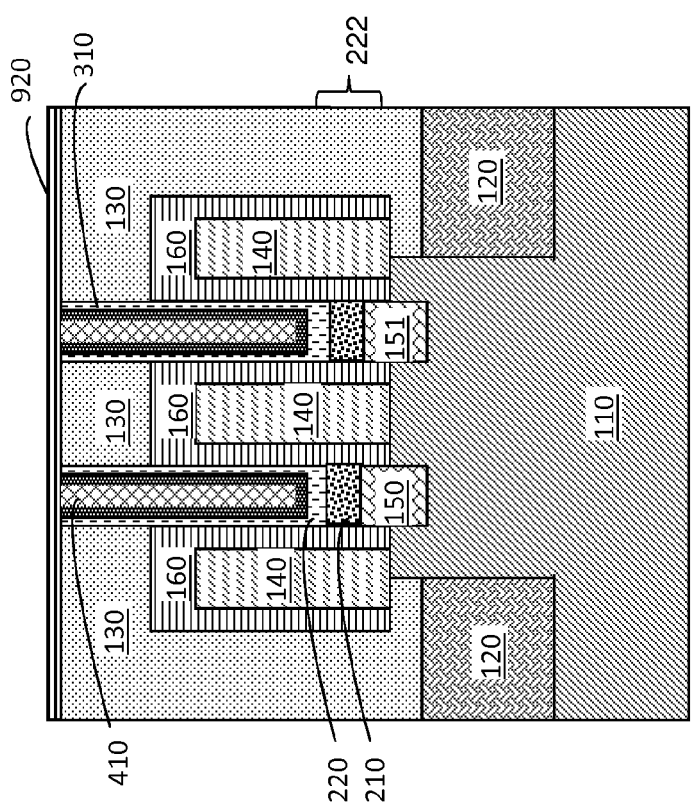
FIG. 9A
FIG. 9B

DIPOLE-BASED CONTACT STRUCTURE TO REDUCE METAL-SEMICONDUCTOR CONTACT RESISTANCE IN MOSFETS

BACKGROUND

The present invention generally relates to metal-oxide-semiconductor field-effect transistors (MOSFET), and more specifically, to source/drain contact structures.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the majority current carriers and is built directly in a p substrate with n-doped source and drain junctions and n-doped gate. The PFET uses holes as the majority current carriers and is built in an n-well with p-doped source and drain junctions and a p-doped gate.

SUMMARY

In one embodiment of the present invention, a transistor device includes a substrate; a source region and a drain region formed over the substrate; and a source/drain contact formed in contact with at least one of the source region and the drain region, the source/drain contact including a conductive metal and a bilayer disposed between the conductive metal and the at least one of the source and drain region, the bilayer including a metal oxide layer in contact with the conductive metal, and a silicon dioxide layer in contact with the at least one of the source and drain region.

In another embodiment, a transistor device includes a fin over a substrate; a source region and a drain region formed over a fin, the source region and the drain region including an epitaxial layer including, but not limited to, silicon; and a source/drain contact formed in contact with at least one of the source region and the drain region, the source/drain contact including a conductive metal and a bilayer disposed between the conductive metal and the at least one of the source and drain region, the bilayer including a metal oxide layer in contact with the conductive metal, and a silicon dioxide layer in contact with the at least one of the source and drain region.

Yet, in another embodiment, a method for making a transistor device includes growing an epitaxial layer including, but not limited to, silicon over a substrate to form a source region and a drain region; growing a layer of silicon dioxide on the epitaxial layer; depositing a layer of a metal oxide onto the layer of silicon dioxide to form a bilayer contact including the the silicon dioxide and the metal oxide; and depositing a conductive metal over the bilayer contact.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-12B illustrate a process flow for forming the source and drain contacts in a PFET and a NFET simultaneously according to the present invention, in which:

FIG. 1A illustrates a cross-sectional side view of a PFET after post self-aligned contact reactive ion etch (RIE) of the source and drain contacts;

FIG. 2A illustrates a cross-sectional side view of the PFET after dipole layer contact formation on the source and drain regions;

FIG. 2B illustrates a cross-sectional side view of the NFET;

FIG. 4A illustrates a cross-sectional side view of the PFET after metal gap filling;

FIG. 4B illustrates a cross-sectional side view of the NFET after metal gap filling;

FIG. 8A illustrates a cross-sectional side view of the PFET after stripping the photoresist;

FIG. 8B illustrates a cross-sectional side view of the NFET after stripping the photoresist;

FIG. 9A illustrates a cross-sectional side view of the PFET after dipole layer formation on the NFET source and drain contacts (see corresponding FIG. 9B);

FIG. 12B illustrates a cross-sectional side view of the NFET after metal CMP.

DETAILED DESCRIPTION

Figure 1B:
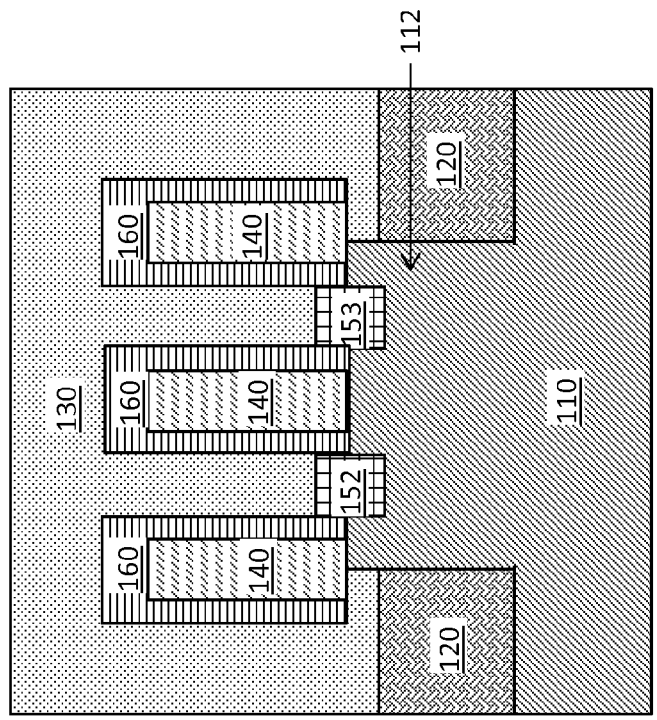
FIG. 1B illustrates a cross-sectional side view of an NFET on the same chip as the PFET in FIG. 1A.

The source/drain contact resistance of the NFET and PFET has limited performance due to the high Schottky barrier height in the source/drain contact (metal-semiconductor junction). Accordingly, embodiments of the present invention provide a source/drain contact that utilizes a bilayer of a high-k material and silicon dioxide ($SiO_2$) that creates a dipole. The potential drop across the dipole modifies the Schottky barrier height and reduces the resistance in the contacts. The oxygen transfer in the form of $O^{2-}$ creates oxygen vacancies, $V_o^{2+}$, in the higher-oxygen areal density ($\sigma$) oxide and the corresponding negative charge in the lower-$\sigma$ oxide that orients the dipole.

As stated above, embodiments of the present invention relate to a MOSFET, and more specifically, to source/drain contact structures, which is now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

FIGS. 1A-12B illustrate a process flow for forming the source and drain contacts in a PFET and an NFET simultaneously according to the present invention. The PFET and NFET are on the same chip/wafer and are shown in parallel figures "A" and "B." for clarity. FIG. 1A illustrates a cross-sectional side view of a PFET after post self-aligned contact reactive ion etch (RIE) of the source and drain contacts. A fin 112 is formed over the substrate 110. The substrate 110 comprises silicon (Si), silicon germanium (SiGe), or any other suitable material. The substrate 110 may be a p-type substrate or an n-type substrate. The fin 112 is etched into the substrate 110. A shallow trench isolation (STI) process is performed to form STI regions 120 on opposing sides of the fin 112. The STI regions 120 are isolation regions formed by etching trenches in the substrate 110 and then filling the trenches with silicon oxide. Alternatively, the trenches may be lined with a silicon oxide liner formed by a thermal oxidation process and then filled with additional silicon oxide or another material. These "filled" STI region 120 trenches define the size and placement of the active regions in between.

A source region 150 and a drain region 151 are formed over the fin 112. The source and drain regions 150 and 151 are formed using an epitaxial growth process to form an epitaxial layer over the fin 112. The epitaxial layer includes, but is not limited to, silicon with p-type dopants, for example, boron, or n-type dopants, for example, phosphorus. The type of dopants depend on the type of transistor, with p-type dopants being used for forming source and drain regions 150 and 151 in a n-type substrate of a PFET as shown in FIG. 1A, and n-type dopants being used to form source and drain regions 152 and 153 in a p-type substrate in a NFET (see FIG. 1B below).

A replacement metal gate (RMG) 140 is formed over the fin 112. The final RMG 140 is formed by initially forming a "dummy" gate made of, for example, polysilicon. The dummy gate material is deposited and etched using known techniques. Then the dummy gate material is removed and replaced with a metal gate material to form the RMG 140. The metal gate material depends on the type of transistor. Non-limiting examples of suitable metal gate materials include tantalum, tantalum nitride, ruthenium, rhenium, tungsten, or any combination thereof. Sidewall spacers 160 are formed around the RMG 140. The sidewall spacers 160 may be formed by depositing a dielectric layer, for example, an oxide, nitride, or other suitable material, followed by a dry etching. An inter-level dielectric (ILD) 130 is formed around the RMG 140. The ILD 130 may be formed from spin-on-glass, borophosphosilicate glass (BPSG), or other suitable materials.

A photoresist (not shown) is applied over the ILD 130 and patterned. A reactive ion etch (RIE) process is performed through the ILD 130 and RMG 140 to expose the source and drain regions 150 and 151.

Figure 1A:
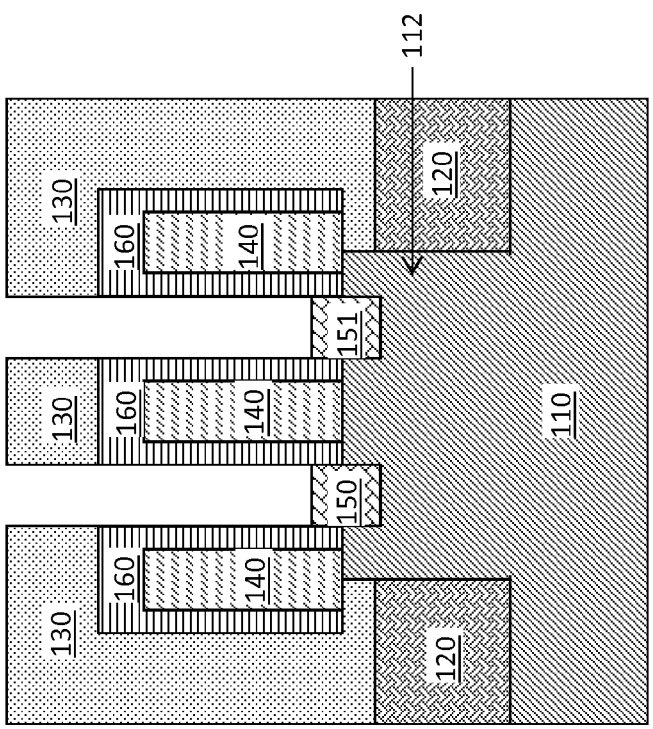

FIG. 1B illustrates a cross-sectional side view of a NFET on the same chip as the PFET in FIG. 1A. The NFET is formed as described above for the PFET in FIG. 1A, except that the source region 152 and the drain region 153 include an epitaxial layer of silicon with n-type dopants.

The epitaxial growth layers in the source regions 150 and 152 and drain regions 151 and 153 can have a thickness in a range from about 5 nm to about 80 nm. In another aspect, the epitaxial growth layers have a thickness in a range from about 20 to about 60 nm. Yet, in another aspect, the epitaxial growth layers have a thickness about or in any range from about 5, 10, 15, 20, 25, 30, 35, 40, 45, 50, 55, 60, 65, 70, 75, and 80 nm.

FIG. 2A illustrates a cross-sectional side view of the PFET after dipole layer contact 222 formation on the source and drain regions 150 and 151. FIG. 2B illustrates a cross-sectional side view of the corresponding NFET on the same chip as the PFET in FIG. 2A. The dipole layer contact 222 is a bilayer including a silicon dioxide layer 210 and a metal oxide layer 220.

The silicon dioxide layer 210 is formed by an ex situ or in situ oxidation process. During ex situ oxidation, an aqueous chemical oxidation is used to form the silicon dioxide. During in situ oxidation, the source region 150 or drain region 151 can be exposed to ozone briefly prior to high k dielectric deposition.

The metal oxide layer 220 is formed by an atomic layer deposition (ALD) technique. In addition to being deposited over the silicon dioxide layer 210, the metal oxide is deposited onto the cavity sidewalls. ALD is a thin film deposition technique that is based on the sequential use of a gas phase chemical process. ALD reactions use two chemicals, called precursors. The precursors react with the surface of a material one at a time in a sequential, self-limiting, manner. To deposit a metal oxide, a metal precursor is flowed alternately with $O_2$, $O_3$, or water. Through the repeated exposure to separate precursors, a thin film is slowly deposited. Suitable precursors and temperatures for thermal ALD are known in the art and can be used.

When the metal oxide layer 220 includes, for example, $Al_2O_3$, trimethylaluminum (TMA) or triethylaluminum can be used with $O_2$, $O_3$, or water. When the metal oxide layer 220 includes, for example, $La_2O_3$, tris[N,N-bis(trimethylsilyl)amide] lanthanum, tris(cyclopentadienyl)lanthanum, or tris(tetramethylcyclopentadienyl)lanthanum can be used with $O_2$, $O_3$, or water.

The silicon dioxide 210 has a thickness in a range from about 0.4 to about 0.8 nm. In another aspect, the silicon dioxide layer 210 has a thickness in a range from about 0.5 to about 0.6 nm. Yet, in another aspect, the silicon dioxide layer 210 has a thickness about or in any range from about 0.4, 0.45, 0.5, 0.6, 0.65, 0.7, 0.75, and 0.8 nm.

The metal oxide layer 220 includes a high-k metal oxide material that creates a substantial dipole when paired with the silicon dioxide layer 210. Together, the silicon dioxide layer 210 and the metal oxide layer 220 form the source and drain contacts. A metal oxide layer 220 includes a material with a high dipole. Table 1 below provides examples of dipole moments for various metal oxides. The higher the magnitude of the dipole moment (eV), the larger the dipole created in the dipole layer contact 222 formed. For p-type source and drain regions in a PFET (FIG. 2A), $Al_2O_3$ and $TiO_2$ are suitable metal oxide materials for the metal oxide layer 220. For n-type source and drain regions in a NFET (see FIG. 9B), SrO and $La_2O_3$ are suitable metal oxide materials for the metal oxide layer 220. Although, other metal oxides may be used. For example, when the transistor device is a PFET device, the metal oxide may be $Al_2O_3$, $TiO_2$, $ZrO_2$, $HfO_2$, MgO, or any combination thereof. When the transistor device is an NFET device, the metal oxide may be $GeO_2$, $Y_2O_3$, $Lu_2O_3$, $La_2O_3$, SrO, or any combination thereof.

TABLE 1

| Dipole moments for metal oxides | | |
|---|---|---|
| | Metal oxide | Dipole (eV) |
| p-type | $Al_2O_3$ | 0.57 |
| | $TiO_2$ | 0.45 |
| | $ZrO_2$ | 0.36 |
| | $HfO_2$ | 0.34 |
| | MgO | 0.28 |
| n-type | $GeO_2$ | −0.10 |
| | $Y_2O_3$ | −0.23 |
| | $LuO_3$ | −0.30 |
| | $LaO_3$ | −0.32 |
| | SrO | −0.51 |

The metal oxide layer 220 can have a thickness in a range from about 0.3 to about 0.8 nm. In another aspect, the metal oxide layer 220 has a thickness in a range from about 0.6 to about 0.7 nm. Yet, in another aspect, the metal oxide layer 220 has a thickness about or in any range from about 0.3, 0.35, 0.4, 0.45, 0.5, 0.55, 0.6, 0.7, 0.75, and 0.8 nm.

Figures 3A, 3B:
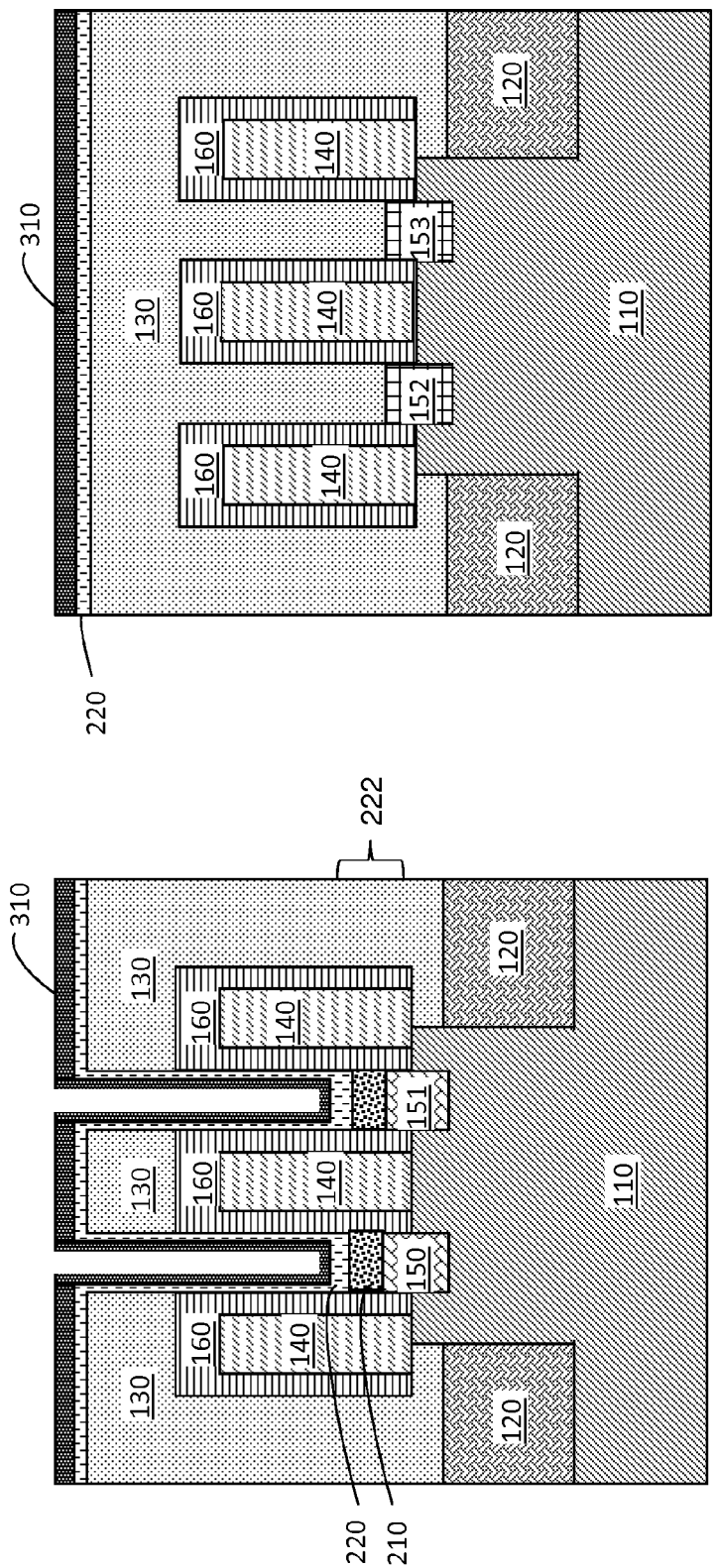
FIG. 3A illustrates a cross-sectional side view of the PFET after depositing a metal liner.
FIG. 3B illustrates a cross-sectional side view of the NFET after depositing a metal liner.

FIG. 3A illustrates a cross-sectional side view of the PFET after depositing a metal liner 310. FIG. 3B illustrates a cross-sectional side view of the NFET after depositing the metal liner 310. The metal liner 310 can include, for example, TiN on Ti. The metal liner is deposited by chemical vapor deposition (CVD), physical vapor deposition (PVD), or another suitable process. The metal liner 310 forms a conformal coating over the exposed surfaces. The metal liner 310 may have a thickness in a range from about 2 to about 8 nm. In another aspect, the metal liner 310 has a thickness in a range from about 3 to about 6 nm. Yet, in another aspect, the metal liner 310 has a thickness about or in any range from about 2, 3, 4, 5, 6, 7, and 8 nm.

FIG. 4A illustrates a cross-sectional side view of the PFET after metal gap filling 410. FIG. 4B illustrates a cross-sectional side view of the NFET after metal gap filling 410. The metal gap filling 410 includes a conductive metal. The dipole layer contact 222 forms the contact between the conductive metal and the source and drain regions 150 and 151. Non-limiting examples of suitable conductive metals include tungsten, aluminum, copper, or any combination thereof.

Figure 5B:
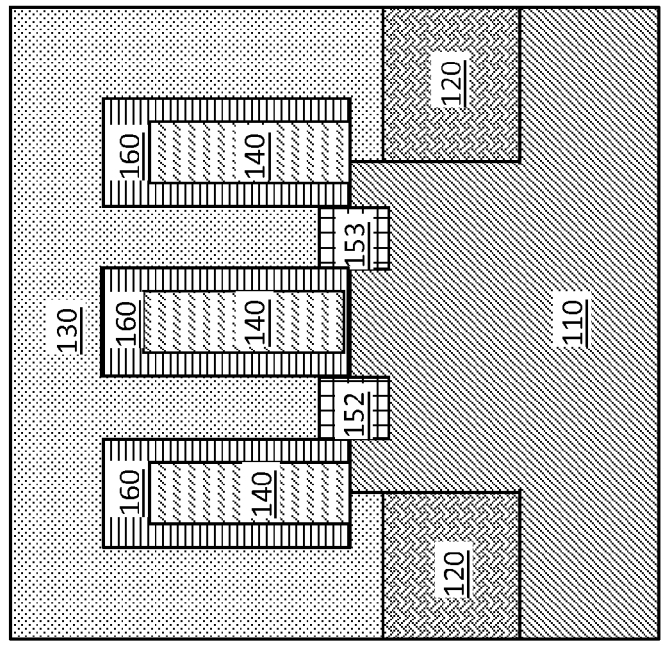
FIG. 5B illustrates a cross-sectional side view of the NFET after CMP.
Figure 5A:
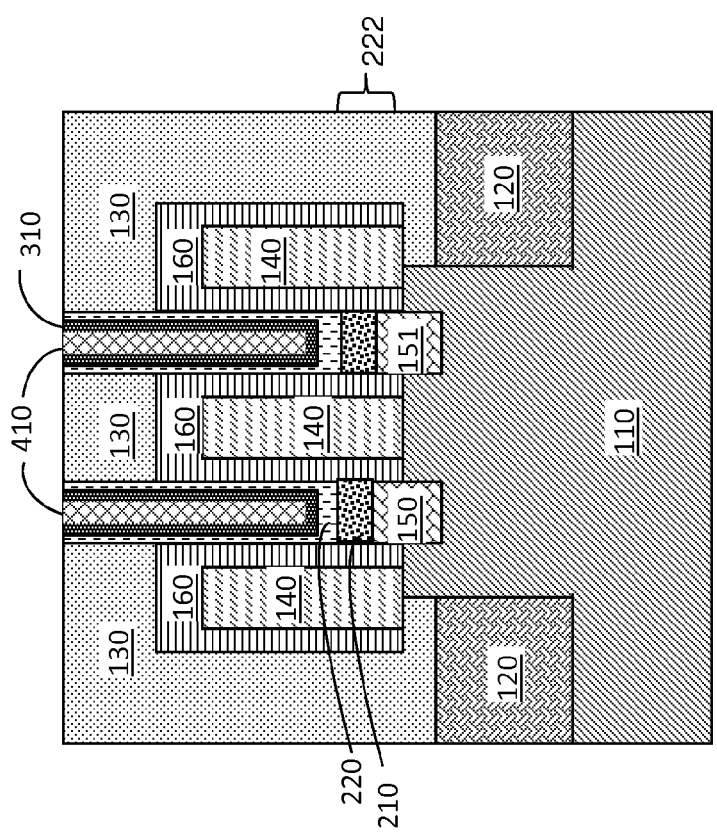
FIG. 5A illustrates a cross-sectional side view of the PFET after metal chemical mechanical planarization (CMP)

FIGS. 5A and 5B illustrate cross-sectional side views of the PFET and NFET, respectively, after a metal chemical mechanical planarization (CMP) process to remove the metals in the metal gap filling 410, the metal liner 310, and metal oxide 220 from the region over the ILD 130. After CMP, the source and drain contacts in the PFET are complete.

Figure 6B:
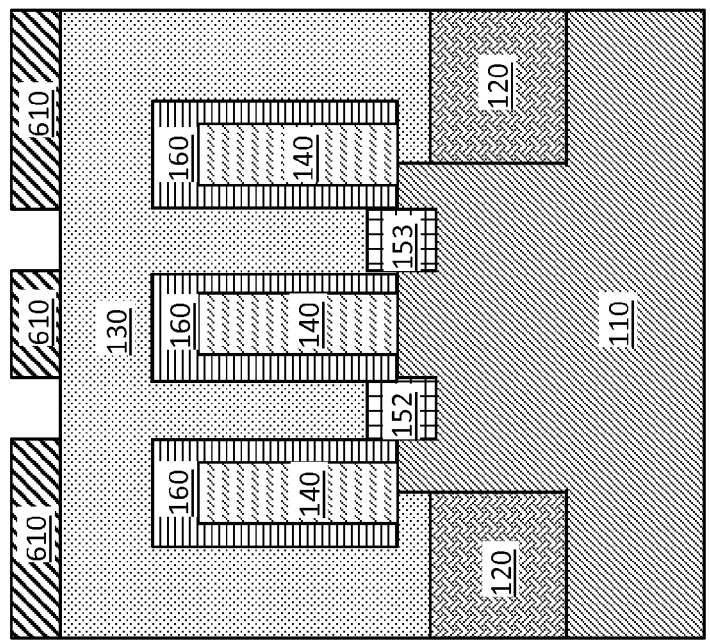
FIG. 6B illustrates a cross-sectional side view of the NFET after photoresist patterning.
Figure 6A:
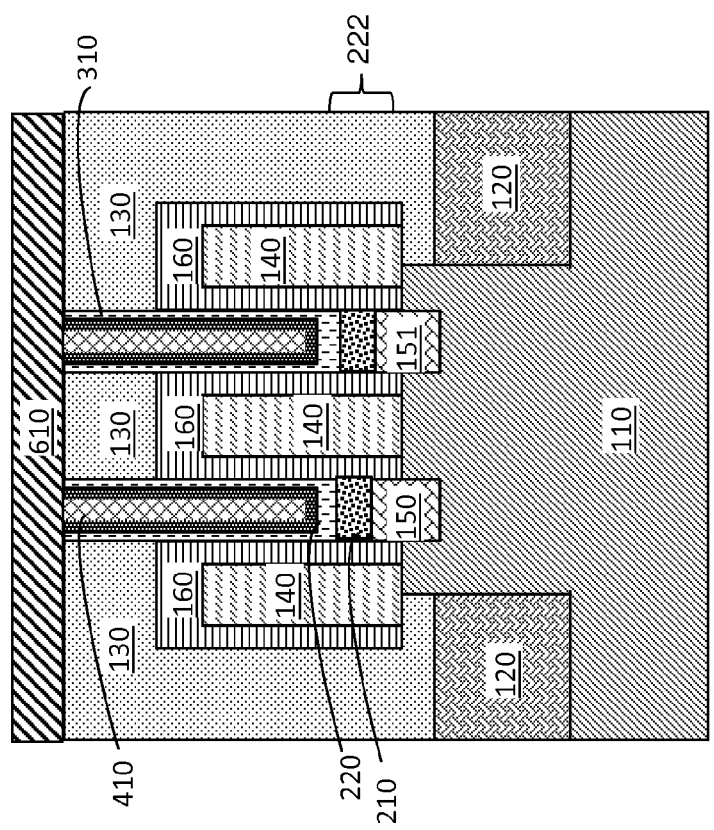
FIG. 6A illustrates a cross-sectional side view of the PFET after photoresist patterning.

FIGS. 6A and 6B illustrate cross-sectional side views of the PFET and NFET, respectively, after photoresist patterning to begin forming the source and drain contacts in the NFET (FIG. 6B). A photoresist layer 610 is applied over the ILD 130 and patterned over the active regions in the NFET between the STI regions 120.

Figure 7A:
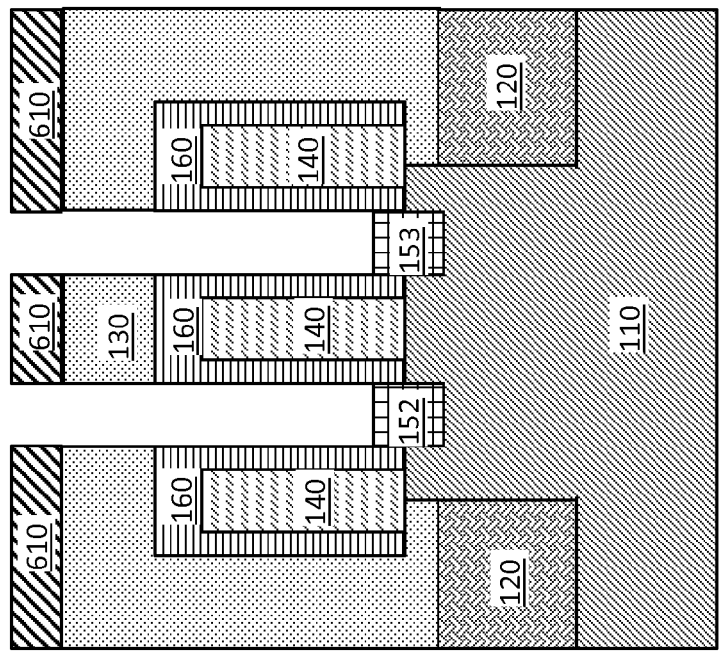
FIG. 7A illustrates a cross-sectional side view of the PFET after self-aligned contact RIE of the NFET source and drain contacts (see corresponding FIG. 7B)
Figure 7B:
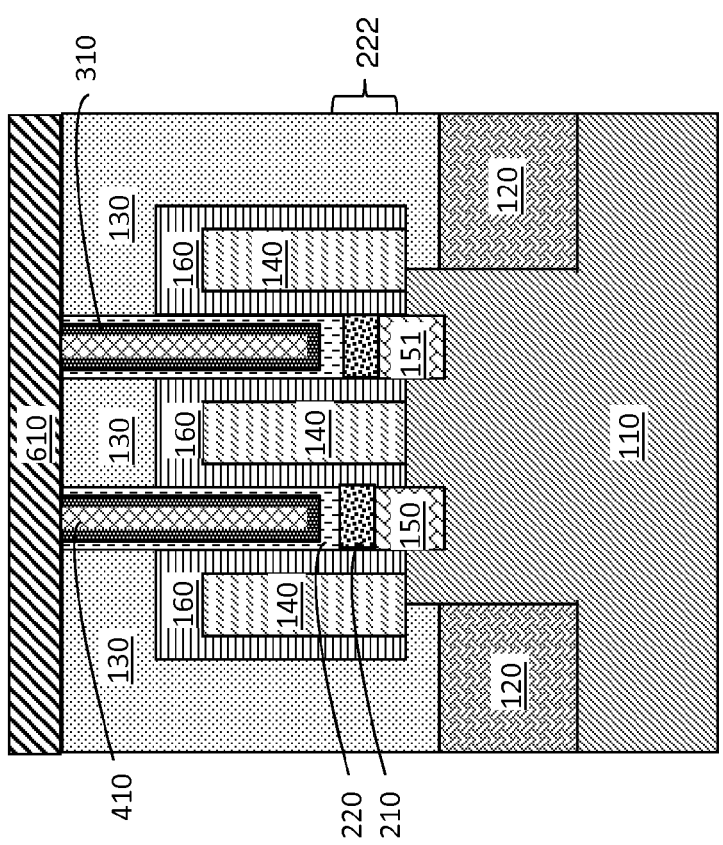
FIG. 7B illustrates a cross-sectional side view of the NFET after self-aligned contact RIE of the source and drain contacts.

FIGS. 7A and 7B illustrate cross-sectional side views of the PFET and NFET, respectively, after self-aligned contact RIE to form the NFET source and drain contacts. FIGS. 8A and 8B illustrate cross-sectional side views of the PFET and NFET after stripping the photoresist 610 from the ILD 130.

FIGS. 9A and 9B illustrate cross-sectional side views of the PFET and NFET, respectively, after dipole layer contact 922 formation on the NFET source and drain regions 152 and 153. The dipole layer contact 922 in the NFET is a bilayer of silicon dioxide layer 910 and a metal oxide layer 920. The silicon dioxide layer 910 is described above in FIG. 2A for the PFET. Also as described above, suitable metal oxides for the metal oxide layer 920 of the NFET (FIG. 9B) include SrO and $La_2O_3$, which provide large dipoles when paired with silicon dioxide. The thicknesses of the silicon dioxide layer 210 and the metal oxide layer 220 for the PFET (FIG. 2A) may be used for silicon oxide layer 910 and metal oxide layer 920. The metal oxide layer 920 is formed by ALD as described above for FIG. 2A.

Figure 10A:
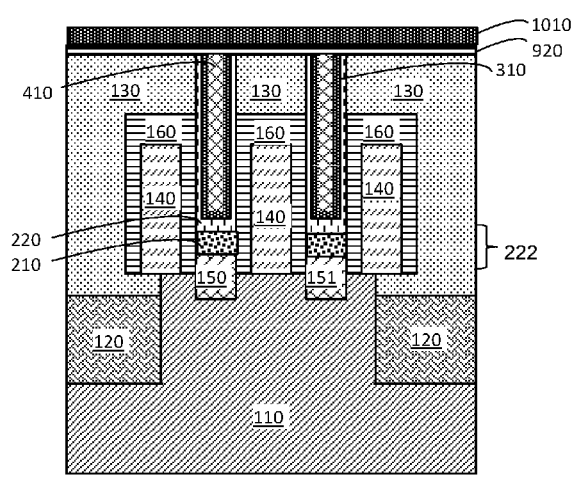
FIG. 10A illustrates a cross-sectional side view of the PFET after forming the metal liner.
Figure 10B:
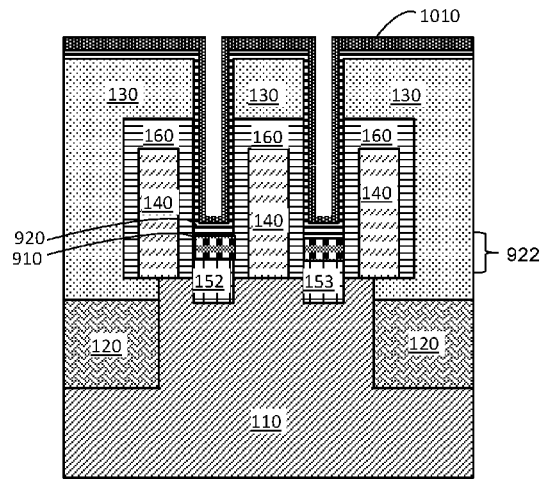
FIG. 10B illustrates a cross-sectional side view of the NFET after forming the metal liner.

FIGS. 10A and 10B illustrate cross-sectional side views of the PFET and NFET, respectively, after depositing a metal liner 1010 over the ILD 130. The metal liner 1010 forms a conformal coating over the exposed surfaces. The thickness of the metal liner 1010 may vary and is described above for the PFET in FIG. 3A.

Figure 11A:
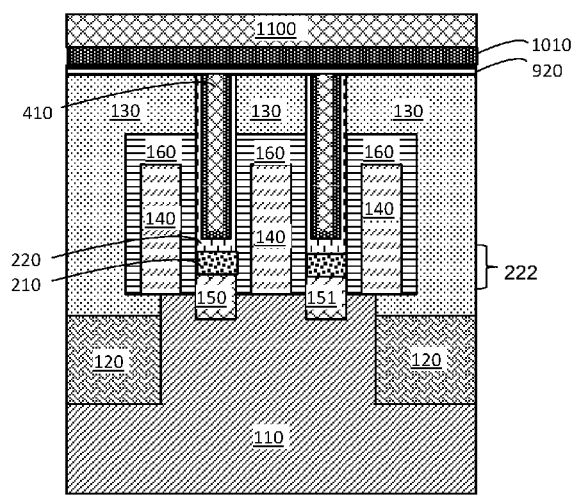
FIG. 11A illustrates a cross-sectional side view of the PFET after metal gap filling.
Figure 11B:
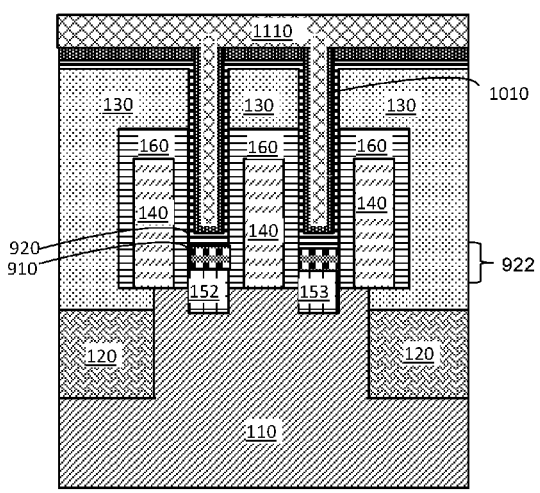
FIG. 11B illustrates a cross-sectional side view of the NFET after metal gap filling.

FIGS. 11A and 11B illustrate cross-sectional side views of the PFET and NFET, respectively, after metal gap filling 1110 with a conductive metal. The dipole layer contact 922 forms the contact between the conductive metal and the source and drain regions 152 and 153. Non-limiting examples of suitable conductive metals include tungsten, aluminum, copper, or any combination thereof.

Figure 12B:
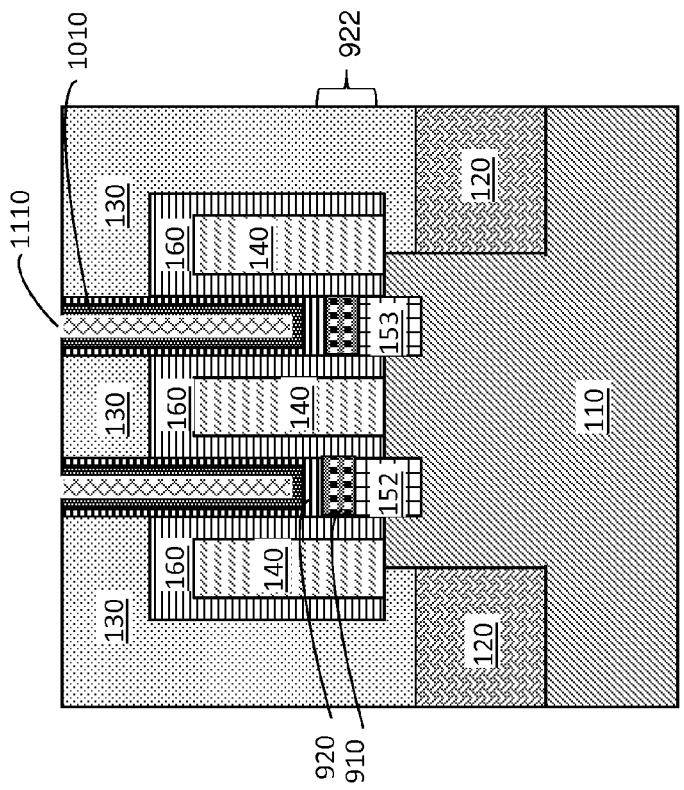
Figure 12A:
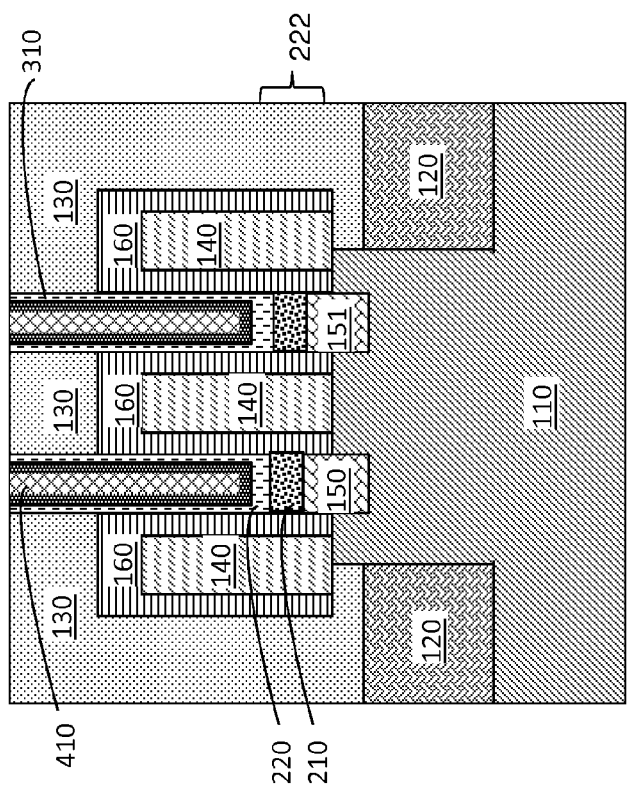
FIG. 12A illustrates a cross-sectional side view of the PFET after metal CMP.

FIGS. 12A and 12B illustrate cross-sectional side views of the PFET and NFET, respectively, after a CMP process to remove the metals in the metal gap filling 1110 and the metal liner 1010 and metal oxide 920 from the region over the ILD 130. After CMP, the source and drain contacts in the NFET are complete.

Example

A source/drain contact on a trench contact epi in accordance with the present invention was prepared and analyzed. The inventive contact included a dipole layer contact of 0.8 nm silicon dioxide and an $Al_2O_3$ layer of varying thicknesses. The dipole layer contact was positioned between a SiGe substrate and titanium. The inventive contact was compared to a conventional contact of conductive titanium directly contacting a SiGe substrate in a transistor.

Figure 13:
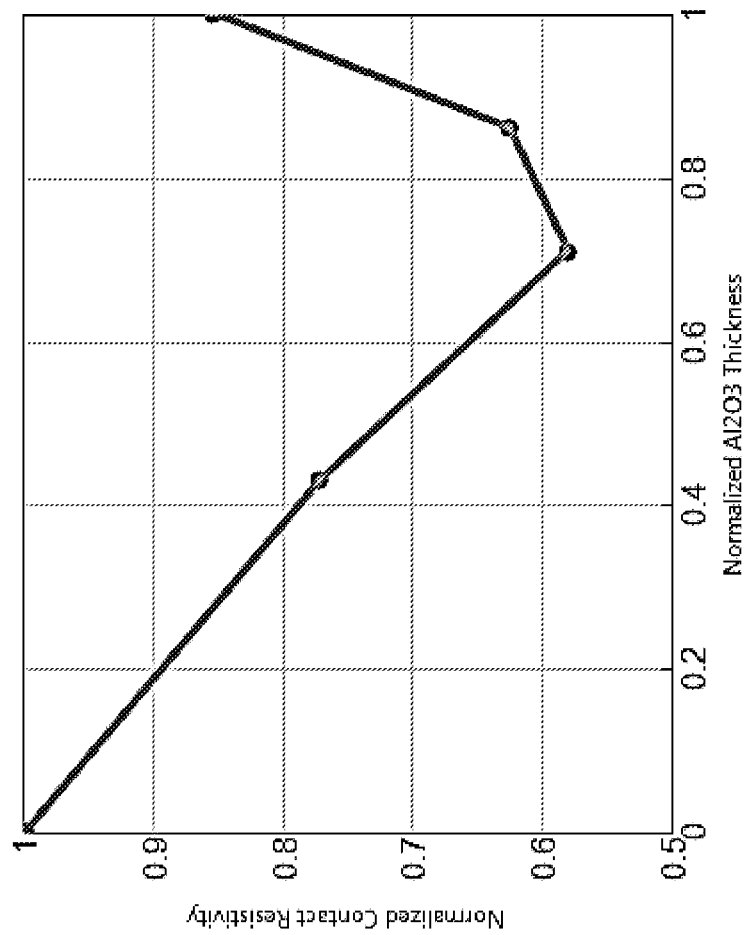
FIG. 13 is a graph of showing contact resistivity ($\rho_c$ or RhoC) as a function of $Al_2O_3$ thickness in a $Al_2O_3/SiO_2$ contact.

FIG. 13 is a graph of normalized contact resistivity (RhoC or p) as a function of normalized $Al_2O_3$ thickness in the $Al_2O_3/SiO_2$ contact. These data demonstrated lower contact resistivity was achieved due to the favorable interface. The dipole layer modulated the Schottky Barrier Height (SBH) and resulted in lower contact resistivity. A 0.5 nm thick $Al_2O_3$ layer with a 0.8 nm $SiO_2$ layer provided an RhoC of about Mid x $10^{-9}$ $\Omega cm^{-2}$.

As described above, the present invention provides a source/drain contact that utilizes a bilayer of a high-k material and silicon dioxide ($SiO_2$) that creates a dipole. The potential drop across the dipole modifies the Schottky barrier height and reduces the resistance in the contacts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor device, comprising:
   a substrate;
   a source region and a drain region formed over the substrate; and
   a source/drain contact formed in contact with at least one of the source region and the drain region, the source/drain contact arranged within a trench between a first gate and a second gate, the source/drain contact comprising a conductive metal, a metal liner, and a bilayer disposed between the metal liner and the at least one of the source and drain region, the bilayer comprising a silicon dioxide layer and a metal oxide layer, and the trench extending continuously from a sidewall spacer on the first gate to a sidewall spacer on the second gate;
   wherein the silicon dioxide layer of the bilayer is arranged only at a bottom of the trench and in contact with the at least one of the source and drain region, the metal oxide layer is disposed on the silicon dioxide layer and disposed on all exposed sidewalls of the trench such that the metal oxide layer directly contacts the sidewall spacer on the first gate and the sidewall spacer on the second gate, the metal liner is disposed on the metal oxide layer, and the conductive metal is disposed on the metal liner and fills the trench.

2. The transistor device of claim 1, wherein the substrate is a p-type substrate.

3. The transistor device of claim 1, wherein the substrate is an n-type substrate.

4. The transistor device of claim 1, wherein the substrate further comprises one or more of silicon and silicon germanium.

5. The transistor device of claim 1, wherein the transistor device is a PFET device, and the metal oxide is $Al_2O_3$, $TiO_2$, $ZrO_2$, $HfO_2$, MgO, or any combination thereof.

6. The transistor device of claim 1, wherein the transistor device is an NFET device, and the metal oxide is $GeO_2$, $Y_2O_3$, $Lu_2O_3$, $La_2O_3$, SrO, or any combination thereof.

7. The transistor device of claim 1, wherein the metal oxide is $Al_2O_3$.

8. The transistor device of claim 1, wherein the metal oxide is $La_2O_3$.

9. A transistor device, comprising:
   a fin over a substrate;
   a source region and a drain region formed over the fin, the source region and the drain region comprising an epitaxial layer comprising silicon; and
   a source/drain contact formed in contact with at least one of the source region and the drain region, the source/drain contact arranged within a trench between a first gate and a second gate, the source/drain contact comprising a conductive metal, a metal liner, and a bilayer disposed between the metal liner and the at least one of the source and drain region, the bilayer comprising a silicon dioxide layer and a metal oxide layer, and the trench extending continuously from a sidewall spacer on the first gate to a sidewall spacer on the second gate;
   wherein the silicon dioxide layer of the bilayer is arranged only at a bottom of the trench and in contact with the at least one of the source and drain region, the metal oxide layer is disposed on the silicon dioxide layer and disposed on all exposed sidewalls of the trench such that the metal oxide layer directly contacts the sidewall spacer on the first gate and the sidewall spacer on the second gate, the metal liner is disposed on the metal oxide layer, and the conductive metal is disposed on the metal liner and fills the trench.

10. The transistor device of claim 9, wherein the silicon dioxide has a thickness in a range from about 0.4 to about 0.8 nanometers (nm).

11. The transistor device of claim 9, wherein the metal oxide has a thickness in a range from about 0.3 to about 0.8 nm.

12. The transistor device of claim 9, wherein the metal oxide is $TiO_2$.

13. The transistor device of claim 12, wherein the transistor device is a p-type field effect transistor (PFET).

14. The transistor device of claim 9, wherein the metal oxide is $La_2O_3$.

15. The transistor device of claim 14, wherein the transistor device is an NFET.

\* \* \* \* \*